United States Patent [19]
Okonogi

[11] Patent Number: 5,872,388
[45] Date of Patent: Feb. 16, 1999

[54] SEMICONDUCTOR DEVICE AND METHOD FOR FABRICATING THE SAME

[75] Inventor: Kensuke Okonogi, Tokyo, Japan

[73] Assignee: NEC Corporation, Tokyo, Japan

[21] Appl. No.: 21,394

[22] Filed: Feb. 10, 1998

Related U.S. Application Data

[62] Division of Ser. No. 562,790, Nov. 27, 1995, Pat. No. 5,726,089, which is a continuation of Ser. No. 157,243, Nov. 26, 1993, abandoned.

[30] Foreign Application Priority Data

Nov. 25, 1992 [JP] Japan ................................. 4-314480

[51] Int. Cl.$^6$ ............................................. H01L 29/00
[52] U.S. Cl. ..................... 257/509; 257/506; 257/508; 257/513
[58] Field of Search ................................. 257/505, 508, 257/509, 513, 520, 536, 506

[56] References Cited

U.S. PATENT DOCUMENTS

| | | | |
|---|---|---|---|
| 4,963,505 | 10/1990 | Fujii et al. | 438/405 |
| 4,985,745 | 1/1991 | Kitahara et al. | 257/506 |
| 5,164,218 | 11/1992 | Tsuruta et al. | 438/405 |
| 5,204,282 | 4/1993 | Tsuruta et al. | 438/406 |
| 5,223,450 | 6/1993 | Fujino et al. | 438/406 |
| 5,234,535 | 8/1993 | Beyer et al. | 438/459 |
| 5,241,210 | 8/1993 | Nakagawa et al. | 257/506 |
| 5,356,827 | 10/1994 | Ohoka | 438/234 |
| 5,374,582 | 12/1994 | Okonogi et al. | 438/419 |
| 5,403,769 | 4/1995 | Fujii | 438/405 |
| 5,420,064 | 5/1995 | Okonogi et al. | 438/406 |
| 5,529,947 | 6/1996 | Okonogi | 438/405 |

FOREIGN PATENT DOCUMENTS

| | | |
|---|---|---|
| 61-059852 | 7/1986 | Japan . |
| 61-164238 | 7/1986 | Japan . |
| 1-112746 | 5/1989 | Japan . |
| 1-144665 | 6/1989 | Japan . |
| 3-126255 | 5/1991 | Japan . |
| 4-029353 | 1/1992 | Japan . |
| 5-259267 | 10/1993 | Japan . |
| 5-267439 | 10/1993 | Japan . |

*Primary Examiner*—Peter Toby Brown
*Assistant Examiner*—Maria Guerrero
*Attorney, Agent, or Firm*—Young & Thompson

[57] ABSTRACT

A semiconductor device having a bonded wafer structure capable of reducing crystal defect in a power element forming region thereof is disclosed. A recess is formed in a control circuit element forming region of a first n– silicon substrate, then filled with a silicon oxide film and subjected to grinding and polishing to provide a mirror-surface. An n– epitaxial layer is formed on the surface of a second n+ silicon substrate, then the surface of the epitaxial layer is coupled to the surfaces of the silicon oxide film and second circuit region of the first substrate and heat-treated to be bonded thereto.

3 Claims, 4 Drawing Sheets

SEMICONDUCTOR DEVICE AND METHOD FOR FABRICATING THE SAME

CROSS-REFERENCE TO RELATED APPLICATIONS

This application is a division of application Ser. No. 08/562,790, filed Nov. 27, 1995, U.S. Pat. No. 5,726,089, which is a continuation of Ser. No. 08/157,243, filed Nov. 26, 1993, now abandoned.

BACKGROUND OF THE INVENTION (a) Field of the Invention

The present invention relates to a semiconductor device and a method for fabricating the same, and more particularly, to a composite semiconductor device having a high power element of a high withstand voltage and control circuit elements integrated in a monolithic structure and a method for fabricating the same.

(b) Description of the Related Art

In a conventional composite semiconductor device having a first circuit region for control circuit elements and a second circuit region for a power element integrated in a monolithic structure, in order to improve the current efficiency, the electrodes of the power element, for example, the source and gate electrodes of a power MOS FET are formed on a main surface of the substrate on which the control circuit elements are formed, and the drain electrode of the power MOS FET is formed on the back surface of the substrate. In this construction, the power element and the control circuit elements must be isolated from each other by an element isolation region.

A conventional method for fabricating a composite semiconductor device will be described below with reference to FIG. 1, which shows a cross-sectional view of the composite semiconductor device. The method is disclosed, for example, in IEEE Power Electronics Specialist Conference 88 Record, April, 1988, pp. 1325 to 1329, and in Japanese Patent Laid-Open Publication NO. 1990-168646. The semiconductor device has a bonded wafer including a first substrate having a high resistivity and a second substrate having a low resistivity.

A first n− epitaxial layer 22A is formed over the entire surface of an n+-type silicon substrate (second substrate) 21. Then, a silicon oxide film 24 is formed on the surface of an n−-type silicon substrate (first substrate) 23. The n+ silicon substrate 21 and the n− silicon substrate 23 are bonded to each other by coupling the silicon oxide film 24 to the first epitaxial layer 22A after washing both the substrates and by a subsequent heat-treatment. Then, the surface of the n− silicon substrate 23, i.e., a main surface of the bonded wafer opposite to the surface on which the silicon oxide film 24 is formed is ground to obtain a predetermined thickness.

Subsequently, the first silicon substrate 23 and the silicon oxide film 24 are removed by an etching in a region 30, then a second n− epitaxial layer 22B is grown thereinto in a thickness equal to the total thickness of the substrate 23 and the silicon oxide films 24 to obtain the region 30 for forming the power element.

Next, an anisotropic etching is applied to the n− silicon substrate 23 at the main surface using a photoresist film as a mask thereby to form V-shaped trenches reaching the surface of the silicon oxide film 24, following which a thin silicon oxide film 7A is formed on the entire surface including the surfaces of the n− silicon substrate 23 and the second epitaxial layer 22B by a thermal oxidation. A laminated layer of a silicon nitride film and a BPSG film is then formed over the entire surface of the silicon oxide film 7A to provide a filling layer 8A. The laminated layer 8A is then ground to expose the silicon oxide film 7A, which is then removed by a wet-etching thereby to expose the surfaces of the n− silicon substrate 23 and the second epitaxial layer 22B and to leave the filling layers 8A.

Finally, a power element and control circuit elements composed of NPN transistors, CMOS FETs or the like are formed in the island regions of the monocrystalline silicon substrate 23 isolated by the silicon oxide film 24 and the filling layers 8A.

With the conventional method for fabricating a composite semiconductor device as described above, the second circuit region 30 for forming a power element is obtained by means of the growth of an epitaxial layer 22B, as a result of which an abnormal growth of polycrystalline silicon occurs at an interface as designated by a circle "A" between the silicon oxide film 24 and the second epitaxial layer 22B. Accordingly, the monocrystalline epitaxial layer 22B of the second circuit region 30 is distorted, and crystal defects such as dislocation and the like will occur. Besides, since the second epitaxial layer 22B is very thick, the epitaxial growth thereof costs a lot of time.

Thus, there arise problems that the yield and reliability of a composite semiconductor device are reduced and that the growth of the epitaxial layer raises the fabrication cost of the composite semiconductor device.

SUMMARY OF THE INVENTION

It is an object of the present invention to provide a composite semiconductor device of a high yield and a high reliability.

It is another object of the present invention to provide a method for fabricating a composite semiconductor device as described above.

According to a first aspect of the present invention, there is provided a semiconductor device comprising: a bonded wafer having a first and a second silicon substrates of a first conductive type, the bonded wafer including a first circuit region in the first silicon substrate and a second circuit region in the first and second silicon substrates, the first silicon substrate having a resistivity higher than the resistivity of the second silicon substrate; an epitaxial layer of the first conductive type formed on the second silicon substrate and having a resistivity substantially equivalent to the resistivity of the first silicon substrate; an insulating buried layer formed in a first circuit region of the first silicon substrate; and a polycrystalline silicon layer formed on the insulating buried layer and having an exposed surface flash with the surface of the second circuit region of the first silicon substrate: wherein the surfaces of the polycrystalline silicon layer and the second circuit region of the first silicon substrate are bonded to the surface of the epitaxial layer thereby to form the bonded wafer.

According to a second aspect of the present invention, there is provided a semiconductor device comprising: a bonded wafer having a first and a second silicon substrates of a first conductive type, the bonded wafer including a first circuit region in the first silicon substrate and a second circuit region in the first and second silicon substrates, the first silicon substrate having a resistivity higher than the resistivity of the second silicon substrate; an epitaxial layer of the first conductive type formed on the second silicon substrate and having a resistivity substantially equivalent to the resistivity of the first silicon substrate; and an insulating layer formed within the first circuit region of the first silicon substrate and having a surface flash with the surface of the second circuit region of the first silicon substrate; wherein the surfaces of the insulating layer and the second circuit region of the first substrate are bonded to the surface of the epitaxial layer thereby to form the bonded wafer.

According to a third aspect of the present invention, there is provided a method for fabricating a semiconductor device having a bonded wafer including a first and a second silicon substrates of a first conductive type and having a first circuit region in the first silicon substrate and a second circuit region in the first and second silicon substrates, the method including steps of: forming a recess within the first circuit region of the first silicon substrate; forming an insulating layer within the recess; forming a polycrystalline silicon layer covering the entire surface including the surfaces of the insulating layer and the second circuit region of the first silicon substrate; grinding and polishing at least the polycrystalline silicon layer to obtain an exposed surface of the polycrystalline silicon layer flash with the surface of the second circuit region of the first silicon substrate; forming an epitaxial layer on the second substrate; bonding the surfaces of the ground polycrystalline silicon layer and the second circuit region of the first silicon substrate to the epitaxial layer thereby to obtain the bonded wafer.

According to a fourth aspect of the present invention, there is provided a method for fabricating a semiconductor device having a bonded wafer including a first and a second silicon substrates of a first conductive type and having a first circuit region in the first silicon substrate and a second circuit region in the first and second silicon substrates, the method including steps of: forming a recess within the first circuit region of the first silicon substrate; forming an insulating layer covering the surface of the first substrate including the surface of the recess and having a thickness larger than the depth of the recess; grinding and polishing at least the insulating layer to obtain an exposed surface of the second circuit region of the first silicon substrate flash with the surface of the insulating layer; forming an epitaxial layer on the second substrate; bonding the surfaces of the ground insulating layer and the second circuit region of the first silicon substrate to the epitaxial layer thereby to obtain the bonded wafer.

BRIEF DESCRIPTION OF THE DRAWINGS

The other and further objects, features and advantages of the present invention will be more apparent from the following description, referring to the accompanying drawings in which.

DESCRIPTION OF THE PREFERRED EMBODIMENTS

The present invention will be described in more detail with reference to the preferred embodiments. FIGS. 2A to 2D are cross-sectional views consecutively showing a fabrication method according to an embodiment of the present invention.

A first silicon substrate 1 of an $n^-$-type doped with phosphorus and having a resistivity of 10 to 30 $\Omega$-cm is prepared. In case that a first silicon substrate of a p– silicon substrate is to be adopted in place of the n– silicon substrate, boron may be doped in a silicon substrate to have the similar resistivity as described above. Next, a first circuit region 31 of the first silicon substrate 1 serving as a region for forming control circuit elements is etched to form a flat recess, then a thin silicon oxide film 2 having a thickness of 0.02 $\mu$m is formed over the entire surface of the first silicon substrate 1 including the surface of the flat recess by applying a mixture gas of hydrogen ($H_2$) and oxygen ($O_2$) as a material gas at about 950° C. On the silicon oxide film 2 is formed a silicon nitride film 3 having a thickness of 0.2 $\mu$m by applying a mixture gas of $SiCl_2H_2$ and $NH_3$ as a material gas at about 700° C. to about 800° C.

Figure 2A:
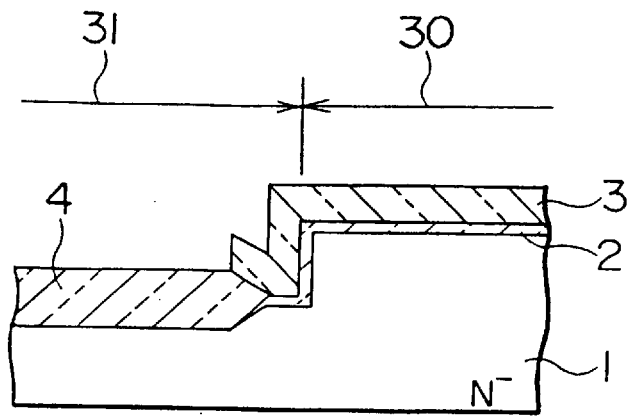
FIGS. 2A to 2D are schematic cross-sectional views of a composite semiconductor device each for showing a step in a method for fabricating the semiconductor device according to a first embodiment of the present invention.

Subsequently, the silicon oxide film 2 and the silicon nitride film 3 formed on the first circuit region 31 of the first silicon substrate are removed by etching, then a thick silicon oxide film 4 having a thickness of 1 $\mu$m is formed by a selective oxidation method within the first circuit region 31 using the remaining silicon nitride film 3 as a mask, as shown in FIG. 2A. The thickness of the thick silicon oxide film 4 is smaller than the depth of the flat recess.

Figure 2B:
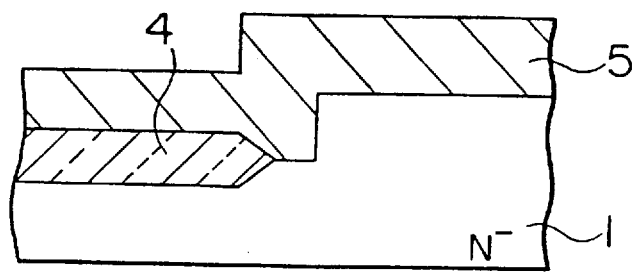

After removing the remaining silicon nitride film 3 and the thin silicon oxide film 2 by a wet-etching, a polysilicon layer 5 is formed over the entire surface including the surfaces of the thick silicon oxide film 4 and the second circuit region 30 of the first silicon substrate 1 by reacting a mixture gas of $SiH_2Cl_2$ and $H_2$ as a material gas at about 600° C., thereby to obtain a structure as shown in FIG. 2B.

Figure 2C:
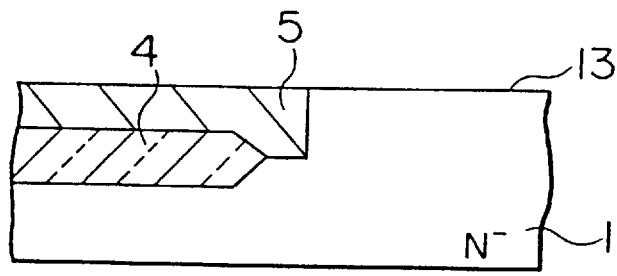

Next, the polysilicon layer 5 thus formed is ground back to expose a second circuit region 30 of the first silicon substrate 1 serving as a region for forming a power element and is polished to obtain a mirror-surface of the polycrystalline silicon layer and the first silicon substrate as shown in FIG. 2C.

Thereafter, a second silicon substrate 11 of an $n^-$-type doped with, for example, antimony and having a lower resistivity of $10^{-3}$ to $2\times10^{-1}$ $\Omega$-cm is prepared. In case that a second silicon substrate of a $p^-$-type is to be adopted in place of n+ silicon substrate, boron may be doped in a silicon substrate. On the second silicon substrate 11 is formed an n– epitaxial layer 12 having a thickness of, for example, about 40 $\mu$m, the thickness being determined depending on the desired withstand voltage of the power element to be formed in the second circuit region 30. The epitaxial growth is carried out, for example, by applying a mixture gas of $SiH_2Cl_2$ and $PH_3$ as a material gas at about 1100° C. and under about 100 Torr.

The polished surface 13 of the polycrystalline silicon layer 5 and the second circuit region 30 of the first silicon substrate 1 is coupled to the n– epitaxial layer 12 of the second silicon substrate 11, then the first and second silicon substrates are heat-treated at about 1100° C. for two hours under a nitrogen atmospheric condition thereby to provide a bonding interface 13 of the first and second silicon substrates having a large bonding strength.

Figure 2D:
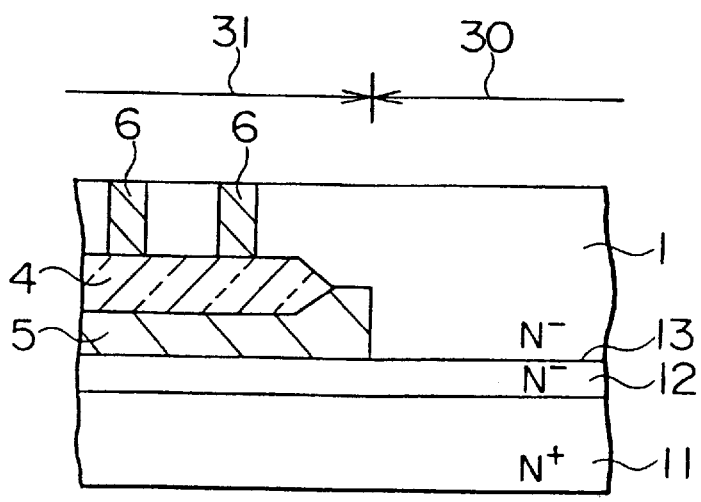

Next, boron is introduced by a vapor-phase diffusion technique or an ion-implantation technique into the first circuit region 31 of the main surface of the wafer, i,e., the surface of the first silicon substrate 1 which is opposite to the bonded surface 13 of the first silicon substrate 1, thereby forming a p+ diffusion layer serving as separating regions 6, which separate the first circuit region 31 from the second circuit region 30 and separating the first circuit region 31 to small element regions in the first silicon substrate 1, as shown in FIG. 2D.

Then, through a process similar to the process as adopted in the conventional method, control circuit elements including CMOS FET and the like are formed on the main surface of the first circuit region 31 of the first silicon substrate 1, and a power element, for example, a power MOS FET is formed in the second circuit region 30 of the first and second substrates 1 and 11.

Figure 1:
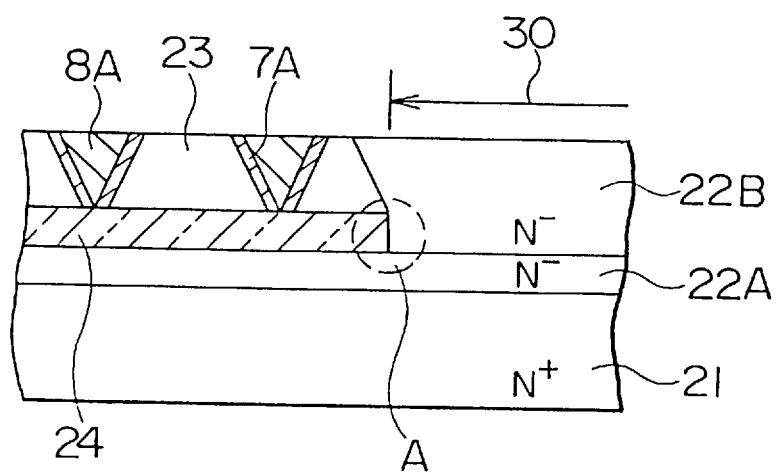
FIG. 1 is a schematic cross-sectional view of a conventional composite semiconductor device.

With the first embodiment as described above, since the second circuit region 30 serving as a region for forming a power element is disposed within the first silicon substrate 1, the conventional second epitaxial layer for the power elements as formed in the semiconductor device of FIG. 1 is not needed. As a result, crystal defect due to abnormal is growth of polycrystalline silicon is not generated at the interface between the first circuit region 30 and the second circuit region 31. In this embodiment, the polycrystalline silicon layer 5 is provided to obtain an equal speed during polishing the surface of the first and second circuit regions and to obtain a sufficient depth for forming the power elements of a high with stand voltage.

Figure 3:
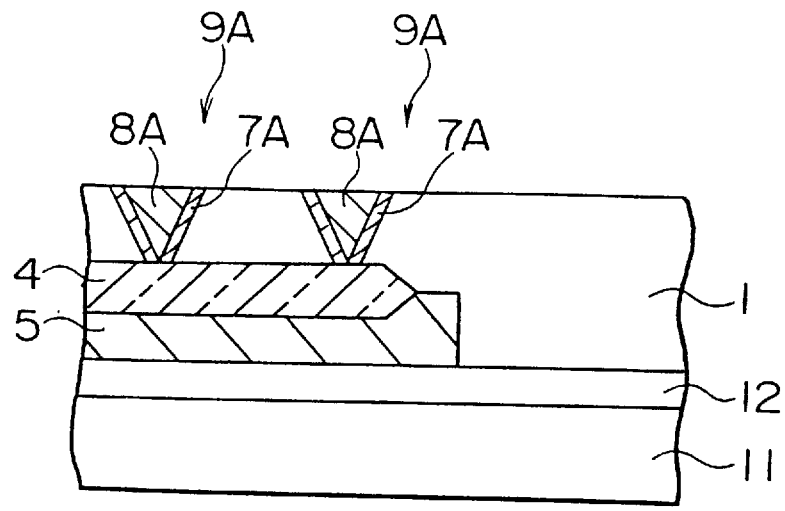
FIG. 3 is a schematic cross-sectional view showing another composite semiconductor device according to a second embodiment of the present invention.

FIG. 3 is a cross-sectional view of another semiconductor device according to a second embodiment of the present invention, which is similar to the first embodiment shown in FIG. 2D except that the element isolation region is formed as V-shaped regions 9A in the second embodiment. The V-shaped region 9A is fabricated after bonding two substrates as follows: An anisotropic dry etching is applied to the main surface of the first silicon substrate 1, to form V-trenches using a solution containing KOH, with the thick oxide film 4 being an etch stop layer. Then, a thin silicon oxide film 7A is selectively formed on respective surfaces of the V-trenches by a thermal oxidation, and thereafter, filling layers 8A each composed of a silicon nitride film and a BPSG film are formed within respective V-shaped trenches by a known CVD technique. A polycrystalline silicon filling layer may be provided on the silicon oxide layer 7A in place of dielectric filling layer 8A.

Figure 4:
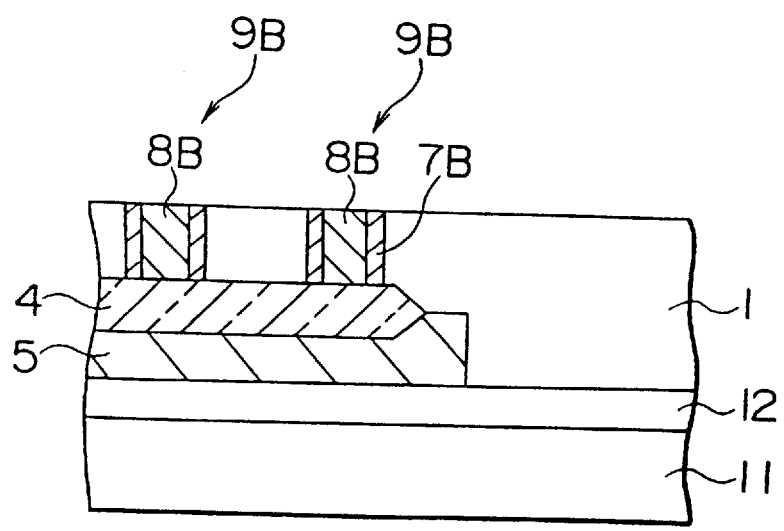
FIG. 4 is schematic cross-sectional view showing still another composite semiconductor device, according to a third embodiment of the present invention.

FIG. 4 is a cross-sectional view showing still another composite semiconductor device according to a third embodiment of the present invention, which is similar to the first embodiment shown in FIG. 2D except that the element isolation region is formed in U-shaped trenches formed by an isotropic etching using an ion-etching technique in this embodiment. Each of the U-shaped isolation regions 9B is constituted by a silicon oxide film 7B and a filling layer 8B composed of a silicon oxide film and a BPSG film. The filling layers 8B may be formed by a polycrystalline silicon layer as is the case in FIG. 3.

The U-shaped trenches can be formed when the total thickness of the n– substrate 1 above the insulating layer 4 is lower than, for example, about 20 $\mu$m. In this case, if the power elements are designed to have a high withstand voltage, the thickness of the epitaxial layer 12 should be large for compensating the small thickness of the first silicon substrate, so that a large amount of time is required for growing the epitaxial layer.

FIGS. 5A to 5D are cross-sectional views consecutively showing another method for fabricating a semiconductor device according to the fourth embodiment of the present invention.

Figure 5A:
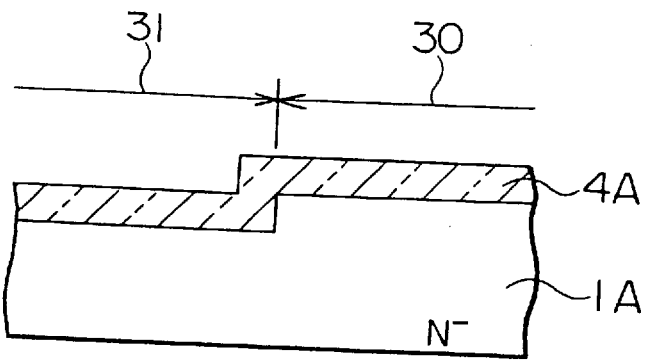
FIGS. 5A to 5D are schematic cross-sectional views of still another composite semiconductor device each for showing a step in another method for fabricating the semiconductor device according to a fourth embodiment of the present invention.
Figure 5B:
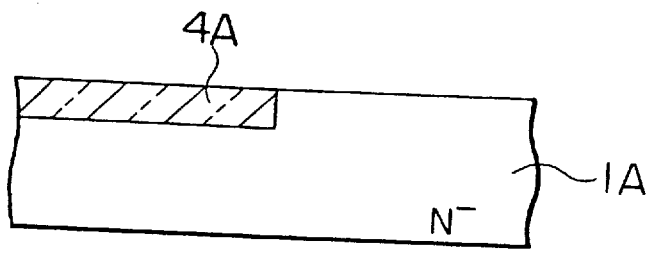

A flat recess is formed for forming control circuit elements in a first circuit region 31 of a first n– silicon substrate 1A having a resistivity of 10 to 30 $\Omega$-cm. Then, a silicon oxide film 4A having a thickness of about 1 $\mu$m is formed over the entire surface of the first silicon substrate 1A including the surface of the flat recess by a local thermal oxidation technique, as shown in FIG. 5A. The silicon oxide film 4A is ground to expose the silicon surface in the second circuit region 30 of the first silicon substrate 1A and polished to a mirror-surface, as shown in FIG. 5B.

Figure 5C:
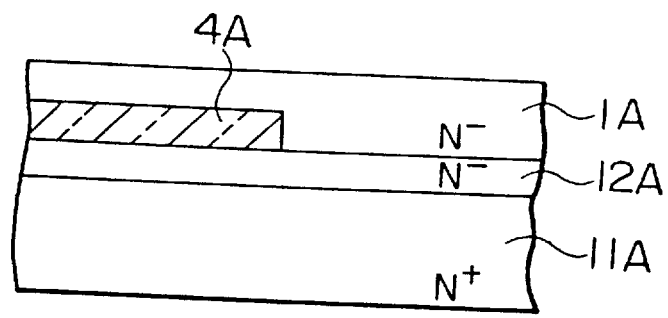
Figure 5D:
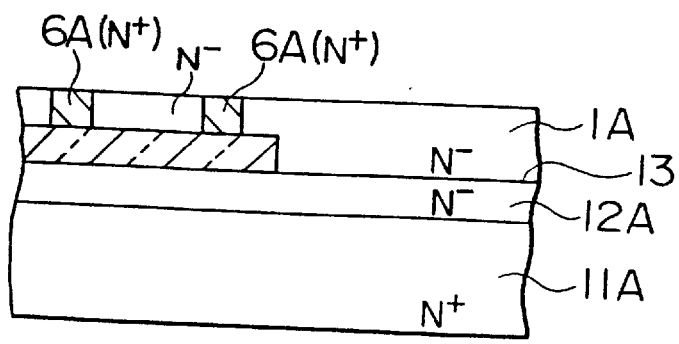

Next, a second silicon substrate 11A of an $n^+$-type is also prepared and an n– epitaxial layer 12A having a thickness of about 40 $\mu$m is formed thereon. The epitaxial growth is carried out, for example, by applying a mixture gas of $SiH_2Cl_2$ and $PH_3$ as a material gas at about 1100° C. and under about 100 Torr. The surface of the epitaxial layer 12A is coupled to the mirror-surface of the first silicon substrate 1A after washing the surfaces thereof, then bonded by a heat-treatment at 1100° C. for about two hours under a nitrogen atmospheric condition thereby to provide a bonding interface 13 having a large bonding strength, as shown in FIG. 5C.

A $p^+$-type diffusion layer serving as element isolation regions 6A is formed in the first region 31 of the first silicon substrate 1A for separating the first circuit region 31 from the second circuit region 30 and separating the first circuit region 30 to small element regions in the first silicon substrate 1A. Subsequent steps are similar to those in the first embodiment and will not be described here to avoid duplication.

In the fourth embodiment, it is easy to form the silicon oxide film 4A for the first circuit region 31 as compared to oxide film 4 of the first embodiment. In addition, similar to the first embodiment, the second circuit region 30 for forming a power element is not formed by an epitaxial growth, as a result of which crystal defect is not generated at the interface 13 of the first and second silicon substrates 1A and 11A.

Besides, although the n-type silicon substrates and epitaxial layer are adopted in the fourth embodiment, silicon substrates of a p-type may be employed in place of the n-type substrate. In addition, the element isolation regions may be formed as V-shaped or U-shaped regions as described before. Modifications of the invention herein disclosed will occur to a person skilled in the art and all such modifications are deemed to be within the scope of this invention as defined by the appended claims.

What is claimed is:

1. A semiconductor device comprising:

a bonded wafer having a first and a second silicon substrates of a first conductive type, said bonded wafer including a first circuit region in said first silicon substrate and a second circuit region in said first and second silicon substrates, said first silicon substrate having a resistivity higher than the resistivity of said second silicon substrate;

an epitaxial layer of said first conductive type formed on said second silicon substrate;

an insulating buried layer in said first circuit region of said first substrate; and a polycrystalline silicon layer on said insulating buried layer and having a surface flush with a surface of said second circuit region of said first silicon substrate:

wherein surfaces of said polycrystalline silicon layer and said second circuit region of said first silicon substrate are bonded to a surface of said epitaxial layer thereby to form said bonded wafer, in which only said polycrystalline silicon layer and said first silicon substrate are bonded to said surface of said epitaxial layer.

2. The semiconductor device as defined in claim 1 wherein said first silicon substrate has a resistivity of 10 to 30 $\Omega$-cm and said second substrate has a resistivity of $10^{-3}$ to $2\times10^{-1}$ $\Omega$-cm.

3. The semiconductor device as defined in claim 1 wherein said first circuit region is separated by a plurality of isolation regions.

* * * * *